United States Patent [19]

Chik

[11] Patent Number: 4,530,099
[45] Date of Patent: Jul. 16, 1985

[54] PLANAR NARROW-STRIPE LASER WITH IMPROVED CHARGE CARRIER CONFINEMENT

[75] Inventor: Kiu-chi D. Chik, Nepean, Canada

[73] Assignee: Northern Telecom Limited, Montreal, Canada

[21] Appl. No.: 448,383

[22] Filed: Dec. 9, 1982

[51] Int. Cl.³ .............................................. H01S 3/19
[52] U.S. Cl. ........................................ 372/45; 357/17; 372/46
[58] Field of Search ................ 372/44, 45, 46; 357/17

[56] References Cited

U.S. PATENT DOCUMENTS 4,426,703  1/1984  Kuroda et al. ........................ 372/46

OTHER PUBLICATIONS

Hong et al., Appl. Phys. Lett. 40(3), 1 Feb. 1982, pp. 208–210.

*Primary Examiner*—James W. Davie
*Attorney, Agent, or Firm*—Stuart L. Wilkinson

[57] ABSTRACT

Double heterostructure lasers which use a narrow stripe contact exhibit linear characteristics with a low lasing threshold current making them very suitable for fiber optic communication systems. Linearity and low threshold currents are achieved if the carrier current injected into the device is confined to a narrow region of the active layer. To further confine the current a p-type diffusion is performed to produce a relatively low conductivity path between the contact stripe and the lasing region of the active layer. Ideally the diffusion front extends to within 0.5 microns of the active layer. In order to achieve this, a p-type double heterostructure second confining layer of 0.5 microns or less is grown immediately adjacent to the active layer and an n-type blocking layer is grown on the second confining layer. By diffusing the p-type dopant through the n-type blocking layer the diffusion front can be accurately monitored using a scanning electron microscope. As soon as the diffusion front merges with the p-type second confining layer then it can be concluded that it is within 0.5 microns of the active layer. Moreover the pn junction between the second confining layer and the blocking layer is reverse biased in use and so provides further charge carrier confinement in comparison with the conventional wholly p-type second confining layer which is usually of the order of 1.5 μm thick.

6 Claims, 1 Drawing Figure

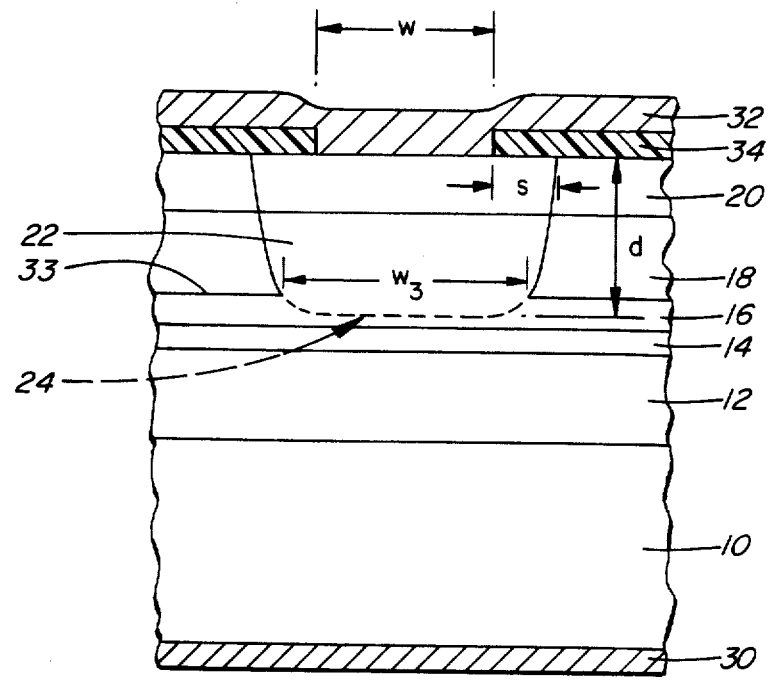

PLANAR NARROW-STRIPE LASER WITH IMPROVED CHARGE CARRIER CONFINEMENT

This invention relates to semiconductor lasers of the double heterostructure type.

Typically double heterostructure lasers are made from III-V type materials. Examples of such materials are the ternary GaAlAs/GaAs and the quaternary GaInAsP/InP systems. By appropriately tailoring the III-V material composition, desired bandgap differences between adjacent layers of the double heterostructure can be obtained and crystalline integrity of the device is secured.

Typically a double heterostructure laser has a substrate, a first confining layer epitaxially grown on the substrate, an active layer epitaxially grown on the first confining layer, a second confining layer epitaxially grown on the active layer and a capping layer epitaxially grown on the second confining layer. Opposed facets of the device are rendered very smooth by cleaving in order to define the ends of a resonant cavity within the active layer. The lateral limits of the resonant cavity can be defined by a number of techniques but one of the most popular is the provision of a narrow stripe contact on the top surface of the laser. A broad area contact is deposited on the bottom, substrate side of the device.

Typically the substrate and first confining layer are n-type materials and the second confining and capping layers are p-type materials. The active layer can be n- or p-type but is of lower bandgap and higher refractive index than the confining layers. In operation, current flows through the double heterostructure from the top stripe contact to the bottom contact. Carriers are injected into the active layer at the forward biased pn junction within the double heterostructure and end up in an excited energy state. A recombination process occurs during which photons are emitted within an active region determined by the diffusion length of the injected carriers. Within the resonant cavity between the two mirror facets stimulated emission occurs; in other words, the device lases. By appropriately confining current and gain within the laser, it can be made to emit very intense light from a very narrow region in the active layer the light ideally being of low order mode since this has advantages in reducing fiber optic transmission losses.

In addition to the stripe contact it is known to introduce a highly conductive region into the heterostructure by providing a narrow p-type diffusion from the top surface of the device to a point just short of the active layer.

One of the problems with performing a p-type diffusion into a p-type material is that it is very difficult to detect the diffusion front using a scanning electron microscope. If the diffusion front is too far from the active layer then it is found that the lasing region of the active layer is far wider than is optimum for achieving low order modes and intense output. On the other hand if the p-type diffusion extends into or past the active layer then the required threshold current is higher and mode problems occur. Another disadvantage of the narrow diffusion being a p-type diffusion within a p-type second confining layer is that charge carriers are encouraged to stay within the diffusion only by the difference in resistivity of the diffused region compared to the resistivity of the parts of the second confining layer which flank it.

A double heterostructure laser structure is now proposed which makes process control easier and which shows stronger charge carrier confinement than known stripe diffusion double heterostructure lasers.

According to one aspect of the invention there is provided a semiconductor laser comprising a substrate, a first confining layer, an active layer, a second confining layer, a blocking layer, and a capping layer, the laser further having a top metal contact layer contacting the capping layer and a bottom metal contact layer contacting the substrate, and a narrow diffusion extending from a narrow stripe region of the top contact layer through the capping layer, the diffusion having a diffusion front partly within the second confining layer and within 0.5 microns of the active layer, the second confining layer being no greater than 0.5 microns in thickness and being of the same conductivity type as said diffusion but of opposite conductivity type to the blocking layer.

The device can have an n-type substrate and first confining layer a p- or n-type active layer, a p-type second confining layer and an n-type blocking layer. The diffusion is preferably a p-type zinc or cadmium diffusion. The wafer can be epitaxially produced on a III-V substrate by liquid phase epitaxy. The laser can be fabricated using any suitable III-V system, for example the GaAlAs or the GaInAsP systems. The operation of diffusing into the blocking layer can be clearly detected using a scanning electron microscope which after suitable chemical etching can distinguish between the diffuse p-type region and outlying parts of the n-type blocking layer. The narrow diffusion region serves to funnel current into a narrow striped region. The pn junction between the second confining layer and the n-type blocking layer laterally outside the stripe is reverse biased in use and so accentuates that confinement.

An embodiment of the invention will now be described by way of example with reference to the accompanying drawing which is a sectional view of a laser according to the invention.

The laser illustrated in the FIGURE has in vertically ascending order the following layers:

an n-type InP substrate 10 about 75 microns thick;

an n-type InP tin doped first confining layer 12 about 3 to 5 microns thick;

an n- or p-type $Ga_{1-x}In_xAs_{1-y}P_y$ tin or zinc doped active layer 14 about 0.1 to 0.3 microns thick;

a p-type InP zinc or cadmium doped second confining layer 16 of thickness 0.5 microns or less;

an n-type InP tin doped blocking layer 18 of a thickness about 1 to 1.3 microns; and an n-type $Ga_{0.47}In_{0.53}As$ capping layer 20 of thickness 0.5 microns.

Extending into the top of the chip is a narrow p-type diffusion 22 which extends from the top surface through the capping and blocking layers to merge with the p-type second confining layer. Because it is so merged, the diffusion front 24 must inevitably be separated from the active layer 14 by less than 0.5 microns. A bottom metal contact layer 30 extends over the lower surface of the entire substrate and a top metal contact layer 32 extends substantially over the whole of the diffused region of the capping layer 20. The top contact layer 32 is separated from the capping layer 20 outside the diffused region by an $SiO_2$ layer 34.

In operation a voltage is applied across the device in a direction so as to reverse bias the pn junction 33 between the second confining layer 16 and the blocking layer 18.

As previously indicated, at the active layer 14, electrons are injected from the n-side to the p-side at one of the active layer junctions with the confining layers, these electrons then being in an excited energy state within the conduction band. A recombination process occurs on the p-side within an active region width determined by the diffusion length of the injected carriers. When the device is pumped by current directed across the active layer 14, electrons are excited to a higher energy level to achieve population invasion and so emit photons of the same wavelength, direction and phase as the stimulating photons. The stimulated emission process, or lasing, occurs very quickly. Although not shown in the FIGURE, mirrors are needed to define the lasing region or resonant cavity to obtain the stimulated emission characteristic of laser behaviour. Such mirrors are produced by natural cleavage of the wafer following processing.

The function of the narrow diffuse region 22 is to funnel current through a narrow region of the active layer 14 in order to obtain intense, localized laser output. By maintaining the diffusion front 24 within 0.5 microns of the active layer 14, the laser output can be limited to low order modes. As shown in the FIGURE the diffusion front of the p-type diffused region is far more easily distinguishable within the n-type blocking layer 18 than in the p-type second confining layer 16. As previously mentioned since the second confining layer used in conventional stripe diffusion heterostructure lasers have been p-type it has proved difficult to detect the diffusion front due to lack of contrast between the diffusion and the second confining layer. By splitting the conventional second confining layer into a relatively thin p-type second confining layer 16 and a relatively wide n-type blocking layer 18 the bandgap, dopant level and refractive index differences between the second confining layer and the active layer required for lasing can be maintained and yet the diffusion front 24 can be accurately detected except where it is within the p-type second confining layer. The deep diffusion 22 funnels current to a very narrow active region by virtue of its lower resistivity. However that funnelling is accentuated by the presence of a reverse biased pn junction between the second confining layer 16 and the blocking layer 18 in the regions flanking the diffused region 22.

The device shown in the FIGURE is fabricated as follows. Firstly the double heterostructure 12, 14, 16, the blocking layer 18 and the capping layer 20 are epitaxially grown on a InP substrate 10 using, for example, the liquid phase epitaxy or the organometallic pyrolysis techniques which are well known in the art. A 1000–1500 Å thick layer 34 of $SiO_2$ is then chemically vapour deposited onto the top surface of the wafer and is photodefined and etched to provide a stripe window 40 of width $W_1$ typically 2–5 μm. A zinc or cadmium diffusion is then performed through the window 40 to produce the p-type diffusion 22. The diffusion is carefully monitored as the diffusion front spreads through the n-type blocking layer. Using the scanning electron microscope both the diffusion front and the pn junction between the blocking layer and the second confining layer can be easily seen. Since the layer 16 is less than 0.5 μm thick, then as soon as the diffusion front broaches the junction 33, it must inevitably be within 0.5 microns of the active layer. The sectional view shown in the FIGURE is not to scale. In fact, in practice, side diffusion s is approximately equal to diffusion depth d.

If narrower current confinement is desired then the p-type second confining layer 16 can be made even thinner for example down to 0.2 microns and the same method can be used for monitoring the progression of the diffusion front to within 0.2 microns of the active layer. Clearly, better current confinement can be obtained if the second confining layer is less than 0.5 μms. However less process tolerances are permitted if a layer of, for example, 0.2 μm is deposited.

Once the diffusion is complete a top (Cr/Au) and bottom metal (AuGe) contacts 32, 30 are vapour deposited onto the top and bottom surfaces respectively of the wafer which is then cleaved into individual chips. The cleaving process leaves facets which are planar, mirror smooth and parallel to one another in order to define opposed surfaces of the laser resonant cavities.

As previously indicated the semiconductor laser can be produced using other III–V systems, for example, the GaAlAs ternary system.

What is claimed is:

1. In a semiconductor laser comprising a substrate, a first confining layer, an active layer, a second confining layer, a blocking layer, and a capping layer, the laser further having a top metal contact layer contacting the capping layer and a bottom metal contact layer contacting the substrate, and a narrow diffusion extending from a narrow stripe region of the top contact layer through the capping layer, said diffusion having a diffusion front partly within said second confining layer, the diffusion front spaced from, and extending to within 0.5 μm of, said active layer, said second confining layer being no greater than 0.5 μm in thickness and being of the same conductivity type as said diffusion and of opposite conductivity type to said blocking layer.

2. In a semiconductor laser as claimed in claim 1, said laser having an n-type substrate and first confining layer, a p- or n-type active layer, a p-type second confining layer and an n-type blocking layer.

3. In a semiconductor laser as claimed in claim 1, said diffusion is a p-type zinc or cadmium diffusion.

4. In a semiconductor laser as claimed in claim 1, the composition of said layers comprise compounds of elements of groups III and V of the periodic table of elements.

5. In a semiconductor laser as claimed in claim 1, the composition of said layers is derived from the GaAs/GaAlAs ternary system.

6. In a semiconductor laser as claimed in claim 1, the composition of said layers is derived from the InP/InGaAsP quaternary system.

* * * * *